US011552125B2

(12) United States Patent
Batude et al.

(10) Patent No.: US 11,552,125 B2
(45) Date of Patent: Jan. 10, 2023

(54) METHOD OF MANUFACTURING AN OPTOELECTRONIC DEVICE COMPRISING A PLURALITY OF DIODES AND AN ELECTRONIC CIRCUIT FOR CONTROLLING THESE DIODES

(71) Applicant: Commissariat à l'Énergie Atomique et aux Énergies Alternatives, Paris (FR)

(72) Inventors: Perrine Batude, Grenoble (FR); Hubert Bono, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/718,792

(22) Filed: Dec. 18, 2019

(65) Prior Publication Data

US 2020/0203422 A1    Jun. 25, 2020

(30) Foreign Application Priority Data

Dec. 19, 2018    (FR) ...................................... 1873315

(51) Int. Cl.
*H01L 27/15*    (2006.01)
*H01L 33/00*    (2010.01)

(52) U.S. Cl.
CPC ........ *H01L 27/156* (2013.01); *H01L 33/0062* (2013.01); *H01L 33/0095* (2013.01)

(58) Field of Classification Search
CPC ................ H01L 25/167; H01L 33/0062–0075
See application file for complete search history.

(56) References Cited

U.S. PATENT DOCUMENTS

| 5,789,766 | A | 8/1998 | Huang et al. |
| 5,893,721 | A * | 4/1999 | Huang ................ H01L 27/156 |
| | | | 438/34 |
| 9,196,606 | B2 * | 11/2015 | Oraw ................... H01L 25/167 |
| 9,281,388 | B2 * | 3/2016 | Briere ................ H01L 29/7787 |
| 2011/0198609 | A1 * | 8/2011 | Huang ................. H01L 33/382 |
| | | | 257/76 |

(Continued)

OTHER PUBLICATIONS

Preliminary Search Report for French Application No. 1873315, dated Aug. 9, 2019.

(Continued)

*Primary Examiner* — Stephen M Bradley
(74) *Attorney, Agent, or Firm* — Wolf, Greenfield & Sacks, P.C.

(57) ABSTRACT

A method of manufacturing an optoelectronic device, including the steps of: a) providing an active diode stack comprising a first doped semiconductor layer of a first conductivity type and a second doped semiconductor layer of the first conductivity type, coating the upper surface of the first layer; b) arranging a third semiconductor layer on the upper surface of the active stack; c) after step b), forming at least one MOS transistor inside and on top of the third semiconductor layer; and d) after step b), before or after step c), forming trenches vertically extending from the upper surface of the third layer and emerging into or onto the upper surface of the first layer and delimiting a plurality of pixels, each including a diode and an elementary diode control cell.

15 Claims, 7 Drawing Sheets

(56) References Cited

U.S. PATENT DOCUMENTS

2016/0064613 A1* 3/2016 Chiu .................... H01L 33/385
                                                    257/13
2019/0355874 A1* 11/2019 Hemer ................. H01L 27/156

OTHER PUBLICATIONS

Lee et al., Monolithic integration of GaN-based light-emitting diodes and metal-oxide-semiconductor field-effect transistors. Optics express. Oct. 20, 2014;22(S6):A1589-95.

* cited by examiner

METHOD OF MANUFACTURING AN OPTOELECTRONIC DEVICE COMPRISING A PLURALITY OF DIODES AND AN ELECTRONIC CIRCUIT FOR CONTROLLING THESE DIODES

This application claims the priority benefit of French patent application number 18/73315, filed on Dec. 19, 2018, the content of which is hereby incorporated by reference in its entirety to the maximum extent allowable by law.

TECHNICAL BACKGROUND

The present disclosure concerns the field of optoelectronic devices. It more specifically concerns a method of manufacturing an optoelectronic device comprising a plurality of semiconductor diodes, for example, gallium nitride diodes, and an electronic circuit for controlling these diodes.

PRIOR ART

An emissive display device comprising an array of gallium nitride (GaN) light-emitting diodes (LEDs), and a control circuit enabling to individually control the LEDs in order to display images, have already been provided.

To form such a device, it may be provided to separately manufacture the control circuit and the LED array, and then to hybridize them, that is, to stack them while connecting them to each other.

A disadvantage of such a manufacturing method is the need to accurately align the control circuit and the LED array during the step of assembly of the two elements, so that each LED is effectively positioned on a metal pad corresponding thereto in the control circuit. Such an alignment is particularly difficult to achieve when the pitch between pixels decreases, and is an obstacle to an increase in the resolution and/or in the pixel integration density.

To overcome this disadvantage, it has been provided, in international patent application WO2017194845 filed by the applicant on May 13, 2016, as well as in French patent application FR3073669 filed by the applicant on Nov. 10, 2017, to:
first form the control circuit in the form of an integrated circuit comprising, on a surface, a plurality of metal pads intended to be connected to the LEDs to be able to individually control the current flowing through each LED;
then place on the surface of the control circuit comprising the metal pads an active LED stack continuously extending over the entire surface of the control circuit; and then
structure the active LED stack to delimit and insulate from one another the different LEDs of the device.

An advantage of such a manufacturing method is that, during the step of transfer of the active LED stack onto the control circuit, the positions of the different LEDs of the device in the active stack are not defined yet. There is accordingly no strong alignment accuracy constraint during the transfer. The delimitation of the different LEDs in the active stack can then be performed by methods of substrate structuring and of deposition of insulating and conductive layers on a substrate, which provide an alignment accuracy much greater than the accuracy that can be obtained on transferring a substrate onto another.

It has further been provided, in French patent application FR3065322 filed by the applicant on Apr. 18, 2017, to:
form an array of LEDs each comprising electrodes accessible from a back side of the array;
placing, on the back side of the LED array, a stack of layers comprising at least one semiconductor layer, a dielectric gate layer, and a layer of conductive gate material; and then
forming from the stack of layers a control circuit coupled to the electrodes of the LEDs.

Here again, an advantage of such a manufacturing method is that, during the step of transfer of the stack of layers onto the LED array, the positions of the components of the control circuit and of the metallizations of connection of the control circuit to the LED array are not defined yet. There is accordingly no strong alignment accuracy constraint during the transfer. The forming of the components of the control circuit and of the metallizations of connection of the control circuit to the LED array may then be performed by integrated circuit manufacturing methods, which provide an alignment accuracy much greater than the accuracy that can be obtained during a transfer of a substrate onto another.

It would however be desirable to at least partly improve certain aspects of the optoelectronic device manufacturing methods described in the above-mentioned patent applications.

SUMMARY

An embodiment provides a method of manufacturing an optoelectronic device, comprising the steps of:
a) providing an active diode stack comprising a first doped semiconductor layer of a first conductivity type and a second doped semiconductor layer of the second conductivity type, coating the upper surface of the first layer;
b) arranging a third semiconductor layer on the upper surface of the active stack;
c) after step b), forming at least one MOS transistor inside and on top of the third semiconductor layer; and
d) after step b), before or after step c), forming trenches vertically extending from the upper surface of the third layer and emerging into the first layer or onto the upper surface of the first layer and delimitating a plurality of pixels, each comprising a diode and an elementary diode control cell.

According to an embodiment, in top view, the trenches form a continuous gate separating the device pixels from one another.

According to an embodiment, the method further comprises a step of filling the trenches with metal to form a metallization of contact with the first semiconductor layer, common to all the pixels of the device.

According to an embodiment, before the filling of the trenches with metal, an insulation layer is deposited on the lateral walls of the trenches.

According to an embodiment, after step b) and before step d), the third semiconductor layer is removed from the trench-forming areas.

According to an embodiment, the third semiconductor layer is not removed from the trench-forming areas before step d).

According to an embodiment, the method further comprises, after step b), a step of forming, in each pixel, a metallization of contact with the second semiconductor layer, and a metallization of contact with the third semiconductor layer.

According to an embodiment, the metallization of contact with the second semiconductor layer and the metallization of contact with the third semiconductor layer are distinct metallizations, connected to each other by a conductive track in contact with the upper surfaces of said metallizations.

According to an embodiment, the metallization of contact with the second semiconductor layer and the metallization of contact with the third conductive layer are confounded and are arranged in a same opening crossing the third semiconductor layer.

According to an embodiment, the method further comprises after step c), a step of depositing a metal-insulator-metal stack, a lower metal layer of the metal-insulator-metal stack being in contact with a conductive gate of said at least one MOS transistor.

According to an embodiment, the method further comprises a step of forming, in each pixel, a metallization in contact both with an upper metal layer of the metal-insulator-metal stack and with the third semiconductor layer.

According to an embodiment, the method further comprises, before step c), the forming of a conductive or semiconductor ground plane between the second semiconductor layer and the third semiconductor layer, the ground plane being insulated from the second and third semiconductor layers.

According to an embodiment, the method comprises a step of forming, in each pixel, a metallization of contact with the ground plane, said metallization being arranged in an opening crossing the third semiconductor layer.

According to an embodiment, the diodes are light-emitting diodes.

According to an embodiment, the first and second semiconductor layers are layers made up of III-V semiconductor materials, and the third semiconductor layer is made of silicon.

According to an embodiment, the method further comprises, after step c), a step of arranging a fourth semiconductor layer on the upper surface of the third semiconductor layer.

According to an embodiment, at step c), the MOS transistor forming temperature does not exceed 500° C.

BRIEF DESCRIPTION OF THE DRAWINGS

The foregoing and other features and advantages will be discussed in detail in the following non-limiting description of specific embodiments in connection with the accompanying drawings, in which.

DESCRIPTION OF THE EMBODIMENTS

Figure 1:
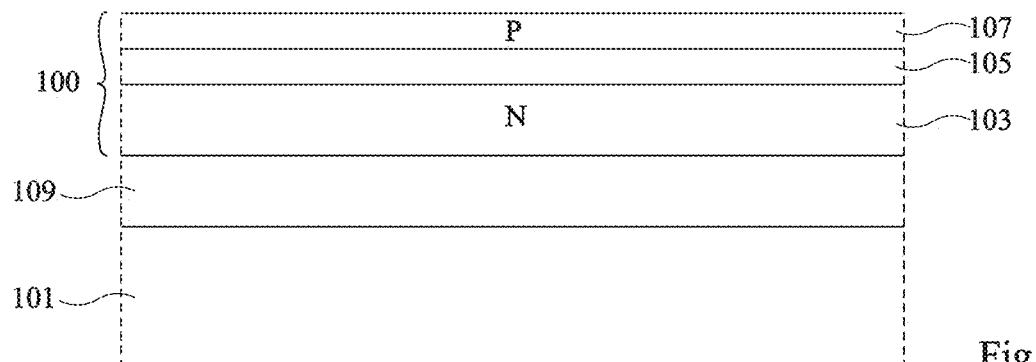
FIG. 1 illustrates a step of a method of manufacturing an optoelectronic device according to an embodiment.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the complete forming of the circuit for controlling the described devices has not been detailed, the forming of such a circuit being within the abilities of those skilled in the art based on the indications of the present disclosure. Further, the composition and the layout of the different layers of an active semiconductor diode stack have not been detailed, the described embodiments being compatible with usual active stacks of semiconductor diodes, particularly gallium nitride diodes.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

The terms "about", "approximately", "substantially", and "in the order of" are used herein to designate a tolerance of plus or minus 10%, preferably of plus or minus 5%, of the value in question.

FIGS. 1 to 9 are cross-section views schematically and partially illustrating successive steps of an example of a method of manufacturing an optoelectronic device according to an embodiment. It should be noted that in FIGS. 1 to 9, only one pixel of the device is entirely shown, it being understood that in practice, a large number of pixels are simultaneously formed on a same support substrate.

FIG. 1 shows an initial structure comprising an active LED stack 100 arranged on the upper surface of a support substrate 101. Substrate 101 is for example made of silicon, of sapphire, of corundum, or of any other material on which an active LED stack can be deposited. In the shown example, active stack 100 comprises, in the following order, starting from the upper surface of substrate 101, an N-type doped semiconductor layer 103, an emissive layer 105, and a P-type doped semiconductor layer 107. Semiconductor layers 103 and 107 are for example made of gallium nitride (GaN). Emissive layer 105 is for example formed by a stack of quantum wells, for example, based on gallium nitride and/or on indium-gallium nitride (InGaN). In the present example, the lower surface of emissive layer 105 is in contact with the upper surface of layer 103, and the upper surface of emissive layer 105 is in contact with the lower surface of layer 107. In practice, according to the nature of substrate 101, a stack 109 of one or a plurality of buffer layers, for example, based on aluminum nitride (AlN), on aluminum-gallium nitride (AlGaN), and/or on gallium nitride may form an interface between support substrate 101 and layer 103. Active stack 100 is for example formed by epitaxy. At this stage, each of the layers 103, 105, and 107 of active stack 100 extends continuously and has a substantially uniform thickness over substantially the entire surface of substrate 101. As an example, the thickness of semiconductor layer 103 is in the range from 100 nm to 3 µm, for example, in the order of 700 nm. The thickness of emissive layer 105 may be in the range from 10 to 200 nm, for example, in the order of 100 nm. The thickness of semiconductor layer 107 is for example in the range from 50 to 300 nm, for example, in the order of 100 nm.

Figure 2:
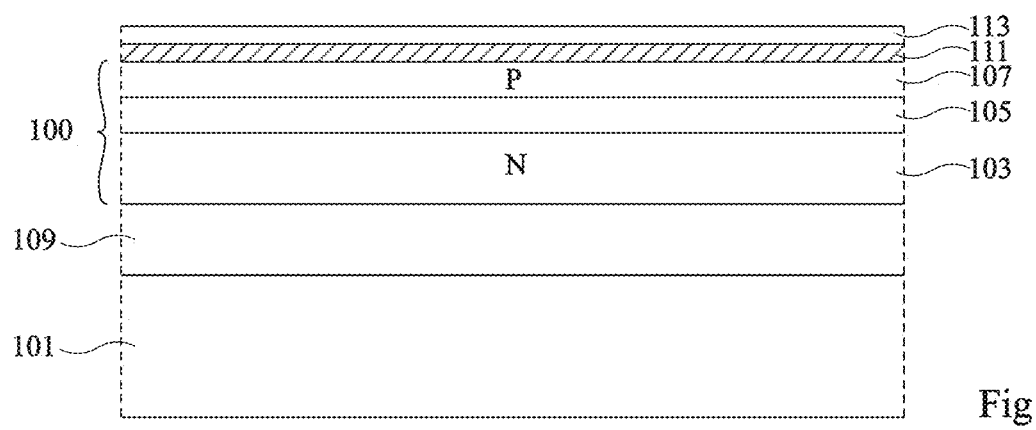
FIG. 2 illustrates another step of a method of manufacturing an optoelectronic device according to an embodiment.

FIG. 2 illustrates a step of deposition of a conductive contact layer 111, for example, a metal layer, on top of and in contact with the upper surface of semiconductor layer 107. Layer 111 is for example made of aluminum. The thickness of layer 111 is for example in the range from 5 to 200 nm, for example, in the order of 100 nm.

FIG. 2 further illustrates a step of deposition of a dielectric bonding layer 113 on the upper surface of conductive layer 111, for example, in contact with the upper surface of conductive layer 111. Layer 113 is for example made of silicon oxide.

At this stage, each of layers 111 and 113 extends continuously and has a substantially uniform thickness over substantially the entire upper surface of substrate 101.

Figure 3:
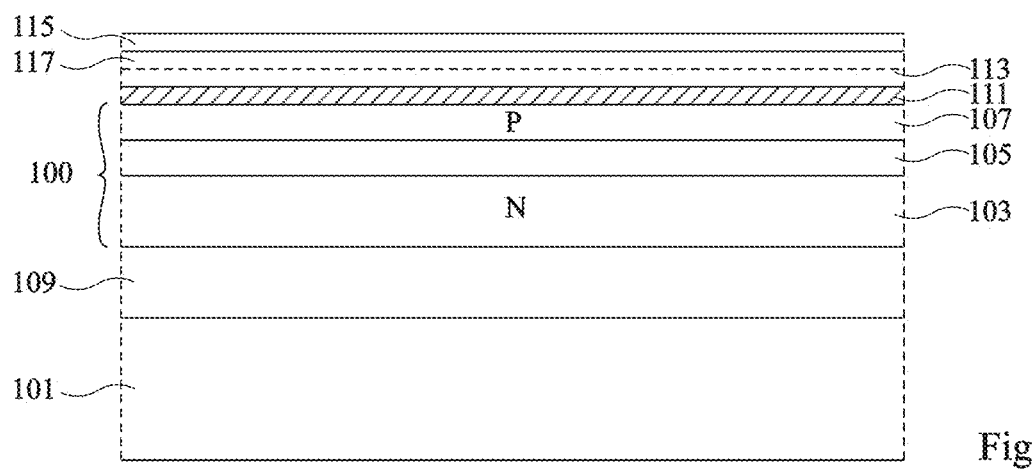
FIG. 3 illustrates another step of a method of manufacturing an optoelectronic device according to an embodiment.

FIG. 3 illustrates a step of forming of a crystal semiconductor layer 115, for example, made of silicon, on the upper surface of dielectric layer 113.

To achieve this, a stack of semiconductor-on-insulator type (SOI), comprising a support substrate (not shown), for example, made of silicon, a buried insulation layer (not shown), for example, made of silicon oxide, coating a surface of the support substrate, and a single-crystal silicon layer, corresponding to semiconductor layer 115 coating the surface of the buried insulation layer opposite to the support substrate, may for example be provided. A dielectric bonding layer 117, for example, made of the same material as dielectric layer 113, is first deposited on the surface of semiconductor layer 115 opposite to the buried insulation layer, after which the SOI stack is placed on the upper surface of layer 113, to place in contact the surface of dielectric layer 117 opposite to semiconductor layer 115 with the upper surface of dielectric layer 113. A direct bonding or molecular bonding of layer 117 on layer 113 is then performed, enabling to affix the SOI stack to layer 113. The support substrate and the buried insulation layer of the SOI stack are then removed to free the access to the upper surface of semiconductor layer 115.

As a variation, it can be started from a solid single-crystal semiconductor substrate (not shown), for example, made of silicon, into which a buried layer of hydrogen atoms is implanted. The buried implanted layer continuously extends over substantially the entire surface of the substrate and forms an interface between an upper surface layer of the substrate, corresponding to layer 115, and the rest of the substrate. A dielectric bonding layer 117, for example, made of the same material as dielectric layer 113, is deposited on the surface of semiconductor layer 115 opposite to the buried implanted layer, after which the assembly is placed on the upper surface of layer 113, to place in contact the surface of dielectric layer 117 opposite to semiconductor layer 115 and the upper surface of dielectric layer 113. A direct bonding or molecular bonding of layer 117 on layer 113 is then performed, enabling to affix the semiconductor substrate to layer 113. The semiconductor substrate is then fractured at the level of the buried implanted layer, to only keep semiconductor layer 115 above active LED stack 100.

As a variation, layer 115 may be formed by deposition of a layer of an amorphous semiconductor material, for example, silicon, on the upper surface of dielectric layer 113, and then recrystallization of the amorphous material, for example, by laser anneal, to obtain crystal layer 115.

At the end of the step of FIG. 3, semiconductor layer 115 extends continuously and has a substantially constant thickness over substantially the entire upper surface of substrate 101. The thickness of layer 115 is for example in the range from 5 to 100 nm. The total dielectric thickness between conductive layer 111 and semiconductor layer 115, corresponding to the sum of the thicknesses of layers 113 and 117 in the shown example, is for example in the range from 10 to 1,000 nm.

Figure 4:
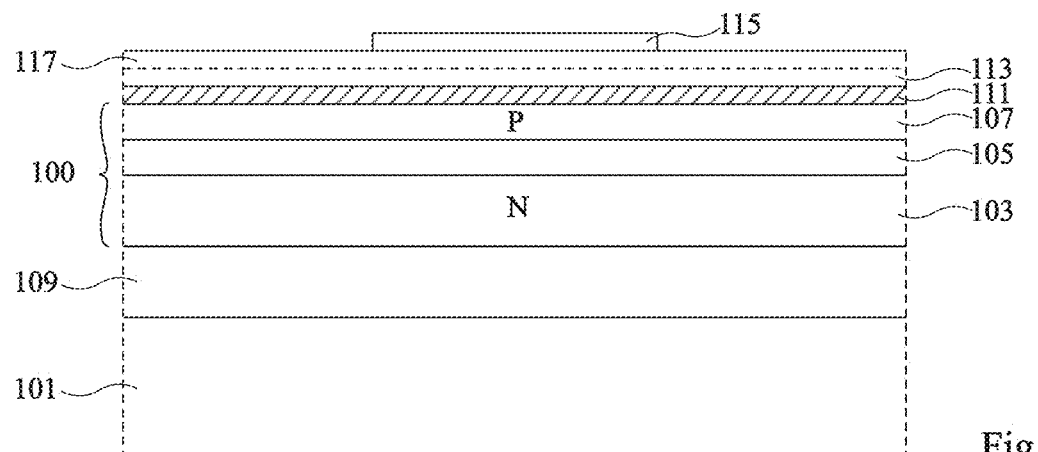
FIG. 4 illustrates another step of a method of manufacturing an optoelectronic device according to an embodiment.
Figure 5:
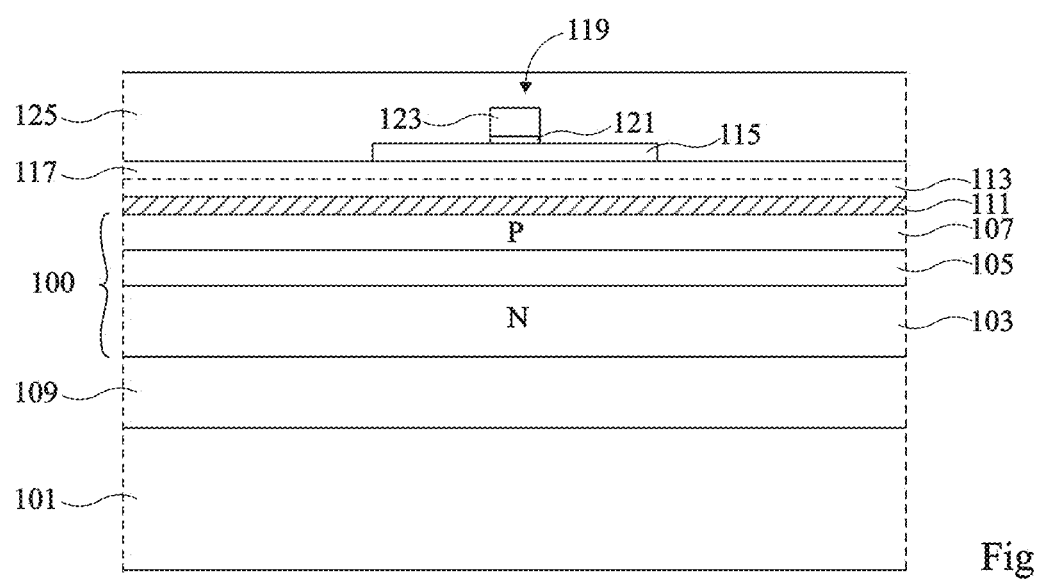
FIG. 5 illustrates another step of a method of manufacturing an optoelectronic device according to an embodiment.

FIGS. 4 and 5 schematically illustrate steps of manufacturing of an electronic control circuit inside and on top of semiconductor layer 115. The control circuit comprises, for each pixel of the device, an elementary control cell connected to the LED of the pixel, enabling to individually control the current flowing through the LED of the pixel and thus the light intensity emitted by the LED of the pixel. Each elementary control cell particularly comprises at least one MOS transistor connected to an electrode of the pixel LED. The electric diagram of the control circuit has not been shown and will not be detailed herein, the described embodiments being compatible with all known electric diagrams of electronic circuits of control of a LED array.

FIG. 4 more particularly illustrates a step of local removal of semiconductor layer 115, for example, by photolithography and etching, stopping inside or on top of the upper surface of dielectric stack 117/113. This step particularly enables to delimit in layer 115, in each pixel of the display device, one or a plurality of semiconductor wells intended to each contain one or a plurality of MOS transistors of the elementary pixel control cell.

FIG. 5 illustrates a step of forming of the gates of the MOS transistors of the control circuit. To achieve this, a gate stack 119 is formed above the channel region of each of the MOS transistors of the control circuit. Gate stack 119 comprises a gate insulator layer 121, for example, made of silicon oxide, arranged on top of and in contact with the upper surface of semiconductor layer 115, and a conductive layer 123, for example, made of doped polysilicon or of metal, arranged on top of and in contact with the upper surface of dielectric layer 121. Gate stack 119 is for example first continuously deposited over the entire surface of substrate 101, and then locally removed, for example, by photolithography and etching, in front of the source and drain regions of the transistors.

It should be noted that the order of the above-mentioned steps of local etching of semiconductor layer 115 (FIG. 4) and of forming of the transistor gates (FIG. 5) may be inverted. Further, the forming of the transistors of the display device control circuit may comprise many other steps, not detailed herein, for example of implantation of the source, drain, and/or gate regions of the transistors, of forming of spacers, of silicidation of the upper surface of the source, drain, and/or gate contact regions of the transistors. Preferably, the transistors of the electronic control circuit are formed under a limited thermal budget, to avoid risking damaging active LED stack 100. As an example, the transistors of the device control circuit are formed by a so-called cold MOS transistor manufacturing method, such that the maximum temperature to which the layers of active LED stack 100 are submitted during the manufacturing of the transistors does not exceed 500° C.

FIG. 5 further illustrates a step subsequent to the manufacturing of the MOS transistors of the control circuit, where a layer 125 of a dielectric material is deposited on the upper surface of the assembly. Layer 125, also called pre-metal dielectric layer, for example continuously extends over substantially the entire surface of the device. The thickness of layer 125 is preferably greater than the sum of the thicknesses of semiconductor layer 115 and of gate stack 119. As an example, the thickness of layer 125 is in the range from 100 nm to 700 nm.

Figure 6:
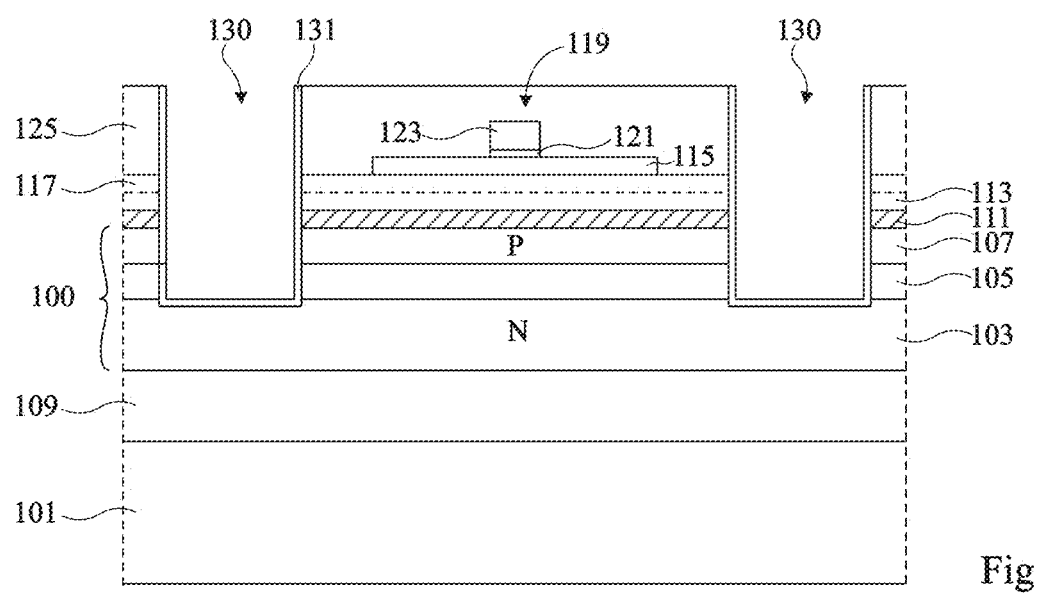
FIG. 6 illustrates another step of a method of manufacturing an optoelectronic device according to an embodiment.

FIG. 6 illustrates a step of etching trenches 130 vertically extending from the upper surface of dielectric layer 125 towards the lower surface of the substrate. At this step, the etching of trenches 130 is interrupted in lower semiconductor layer 103 of active LED stack 100 or on the upper surface of lower semiconductor layer 103. Trenches 130 delimit islands or mesas each corresponding to a pixel of the device, it being understood that each pixel comprises an individually-controllable LED (that is, controllable independently from the other LEDs of the device) and an elementary LED control cell. Thus, trenches 130 delimit, in active LED stack 100, a plurality of individually-controllable LEDs and, in the stack comprising semiconductor layer 115 and gate stacks 119, a plurality of corresponding elementary control cells, each elementary control cell being intended to control the underlying LED. In top view, the pixels of the device may be arranged in an array, trenches 130 forming a continuous gate such that each pixel is totally surrounded with trenches 130, and such that two neighboring pixels are separated from each other by a trench 130.

It should be noted that in the present example, semiconductor layer 115 has been previously removed, during the step of FIG. 4, from the areas where trenches 130 are formed. The etching of trenches 130 thus does not cross semiconductor layer 115. The described embodiments are however not limited to this specific case.

FIG. 6 further illustrates a step of forming insulating spacers 131, for example, made of silicon oxide or of silicon nitride, on the lateral walls of trenches 130. As an example, to form spacers 131, a layer of an insulating material is first continuously deposited over the entire upper surface of the assembly, for example, by a conformal deposition method, after which the horizontal portions of the insulation layer are removed, for example, by vertical anisotropic etching, to only keep the portions of the insulation layer located on the lateral walls of the trenches, such portions forming spacers 131.

Figure 7:
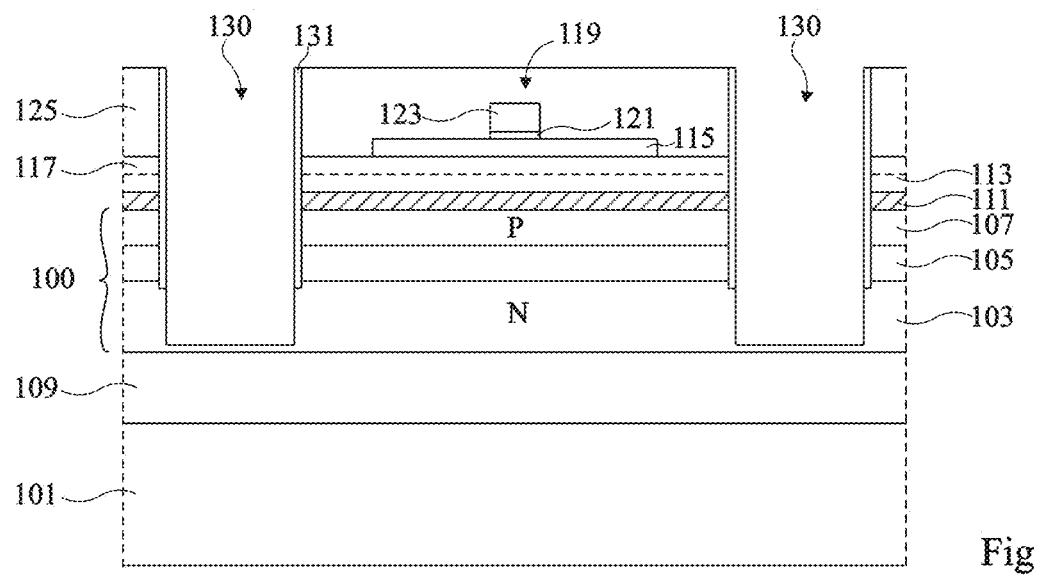
FIG. 7 illustrates another step of a method of manufacturing an optoelectronic device according to an embodiment.

FIG. 7 illustrates a step of extension of trenches 130 in lower semiconductor layer 103 of the LED stack. In the shown example, the etching is interrupted before reaching the lower surface of layer 103, that is, trenches 130 do not totally cross layer 103. As a variation, trenches 130 may totally cross layer 103. During this step, the sides of anode contact conductive layer 111 and of layers 107 and 105 are protected from etching by spacers 131.

Figure 8:
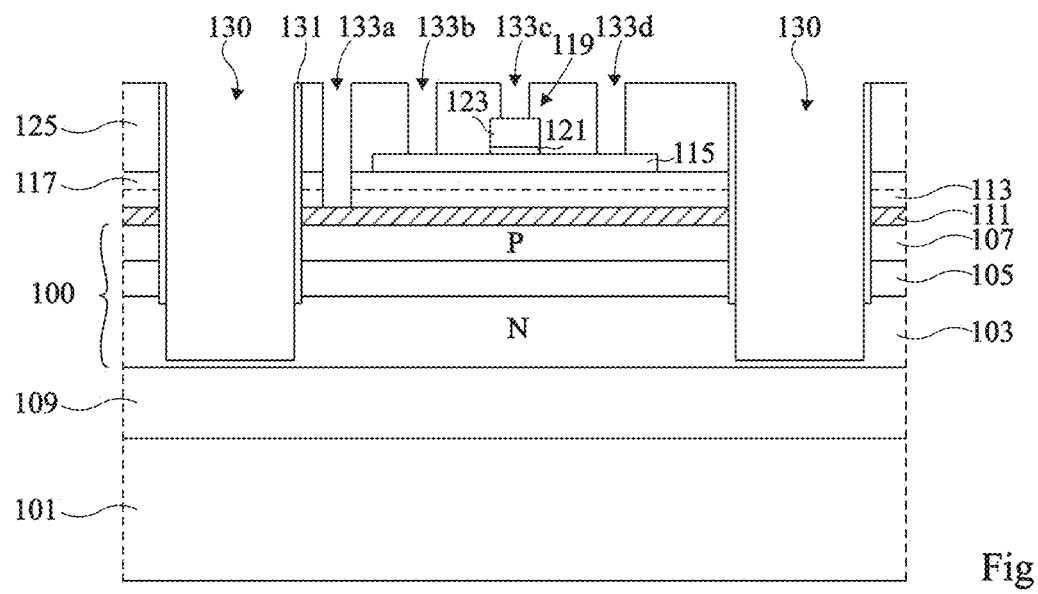
FIG. 8 illustrates another step of a method of manufacturing an optoelectronic device according to an embodiment.

FIG. 8 shows a step of forming, in each pixel of the device, contact openings extending vertically from the upper surface of dielectric layer 125 towards the lower surface of the substrate, and emerging onto source, gate, and drain contact regions of the MOS transistors and onto the anode contact conductive layer 111 of the pixel. In the example of FIG. 8, an opening 133a emerging onto the upper surface of anode contact layer 111 of the pixel, an opening 133b emerging onto the upper surface of semiconductor layer 115, on a first conduction region (source or drain) of a MOS transistor of the pixel, an opening 133c emerging onto the upper surface of the conductive gate layer 123 of a MOS transistor of the pixel, and an opening 133d emerging onto the upper surface of semiconductor layer 115, on a second conduction region (drain or source) of a MOS transistor of the pixel have been more particularly shown in each pixel.

Openings 133a, 133b, 133c, 133d may be formed during a same photolithography and etch step. The described embodiments are however not limited to this specific case. It should be noted that, in the present example, semiconductor layer 115 has been previously removed, during the step of FIG. 4, from the areas where openings 133a are formed. The etching of openings 133a thus does not cross semiconductor layer 115. The described embodiments are however not limited to this specific case. Further, although this has not been shown in the drawings, the upper surfaces of the source, drain, and possibly gate (in the case where the gates are made of polysilicon) contacting areas of the transistors may have been previously silicided during the manufacturing steps of FIGS. 4 and 5, which enables to ease the stopping of the etching of openings 133b, 133c, and 133d, and to decrease the resistances of access to the source, drain, and possibly gate regions of the transistors.

Figure 9:
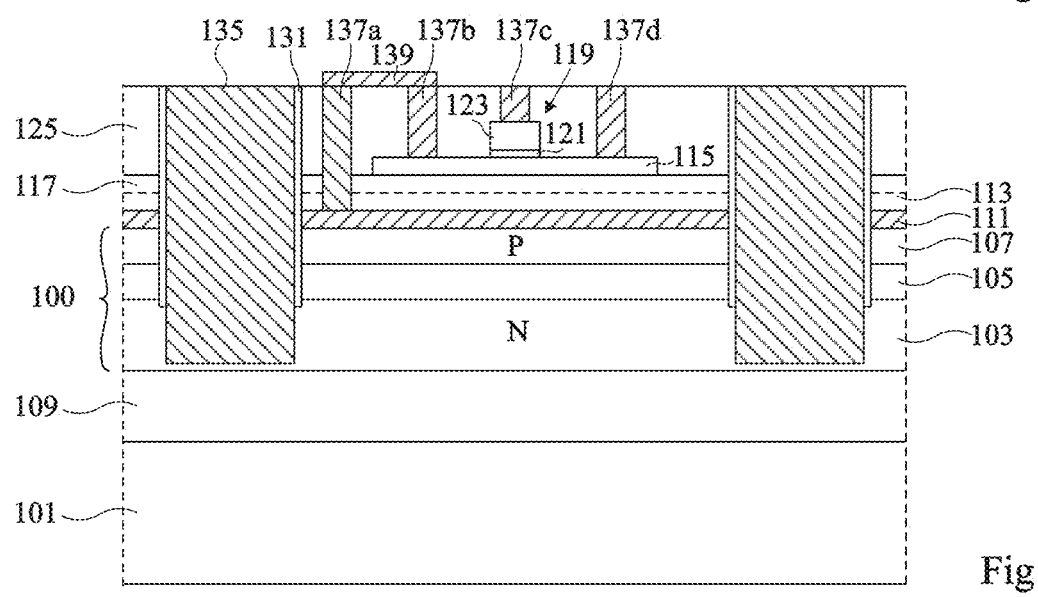
FIG. 9 illustrates another step of a method of manufacturing an optoelectronic device according to an embodiment.

FIG. 9 illustrates a step of filling trenches 130 with metal, for example, copper, to form a cathode contact metallization 135 common to all the LEDs of the display device. In the present example, the trenches are totally filled with metallization 135. Metallization 135 is in contact with layer 103 at the bottom and over a lower portion of the lateral walls of trenches 130. Metallization 135 is however insulated from layers 105, 107, and 111 by spacers 131.

FIG. 9 further illustrates a step of filling openings 133a, 133b, 133c, and 133d with metal, for example, tungsten, to form:

in each opening 133a, an anode contact metallization 137a specific to the underlying LED,
in each opening 133b, a source or drain contact metallization 137b specific to the underlying transistor;
in each opening 133c, a gate contact metallization 137c specific to the underlying transistor; and
in each opening 133d, a drain or source contact metallization 137d specific to the underlying transistor.

Metallizations 137a, 137b, 137c, 137d may be formed simultaneously. The described embodiments are however not limited to this specific case. Metallizations 137a, 137b, 137c, 137d may be formed before, at the same time as, or after metallization 135.

FIG. 9 further illustrates an optional step of forming, in each pixel, on the upper surface of dielectric layer 125, a conductive connection element 139, for example, a metal track, connecting the anode contact metallization 137a of the pixel to a source or drain contact metallization 137b of a MOS transistor of the elementary pixel control cell. Connection element 139 is for example a copper track arranged on the upper surface of the assembly, in contact by its lower surface, on the one hand, with the upper surface of metallization 137a and, on the other hand, with the upper surface of metallization 137b.

Other conductive interconnection tracks (not shown) may be provided to, in each pixel, connect one or a plurality of contact metallizations of the pixel to a peripheral or external circuit for controlling the device.

The display device thus formed is intended to emit light through its lower surface. As an example, substrate 101 is a transparent substrate, for example, made of sapphire, which enables not to block the passage of light. As a variation, in the case where substrate 101 is not transparent, it may be removed. A support handle, for example, in the form of a silicon substrate, may possibly be affixed to the upper surface of the assembly before the removal of substrate 101, to ensure the mechanical resistance of the assembly.

An advantage of the manufacturing method described in relation with FIGS. 1 to 9 is that it has a small number of steps, particularly as compared with the methods described in the above-mentioned patent applications.

As compared with the method described in above-mentioned French patent application FR3065322, an advantage is that the transfer of semiconductor layer 115 onto the upper surface of the active LED stack is simplified by the fact that the active LED stack has not been structured yet at the time of the transfer. It is in particular possible to perform the transfer with a dielectric interface layer (stack of layers 113 and 117) of very small thickness, for example, smaller than 50 nm.

Further, in the above-described method, the thermal budget for the forming of the control circuit, instead of being limited by the LED connection elements as is the case in above-mentioned French patent application FR3065322, is only limited by the stability of the active LED stack.

Although an embodiment where the electronic LED control circuit is formed in a single semiconductor level, corresponding to semiconductor layer 115, has been described hereabove, the described embodiments are not limited to this specific case. As a variation, a second semiconductor level may be provided above dielectric layer 125, having other elements of the LED control circuits formed therein. In this case, the transistors of higher power supply voltage of the control circuit are preferably formed in the first semiconductor level (that is, at closest to the LEDs), and the transistors of lower power supply voltage may be located in the second semiconductor level. The second conductive level may be formed by means of a so-called sequential 3D technology, similarly to what has been described hereabove for the forming of the first level, that is, by deposition or transfer of an additional semiconductor layer on the upper surface of dielectric layer 125, and then forming of MOS transistors inside and on top of the additional semiconductor layer. As a variation, the second conductive level may be formed in so-called parallel 3D technology, that is, formed separately from the device of FIG. 9, and then hybridized with the upper surface of the device of FIG. 9.

Further, the described embodiments are not limited to the specific example of sequence of the steps of the method described in relation with FIGS. 1 to 9. It should in particular be noted that, as a variation, trenches 130 may be formed between the step of transfer of semiconductor layer 115 of FIG. 3 and the steps of forming of the MOS transistors of FIGS. 4 and 5, or also after or at the same time as the steps of forming of contact metallizations 137a, 137b, 137c, and 137d of the pixels.

Further, as a variation, the intermediate metal layer 111 between semiconductor layers 107 and 115 may be omitted. In this case, bonding layer 113 is directly deposited on layer 107, and the metallization for contacting layer 107 is located inside of opening 133a (FIG. 8). This enables to release the thermal budget constraint on the upper MOS transistor.

It should further be noted that one or a plurality of steps of local implantation (by lithography) of dopant elements in one or a plurality of the semiconductor layers of stack 100 may possibly be provided before the transfer of semiconductor layer 115.

Figure 10:
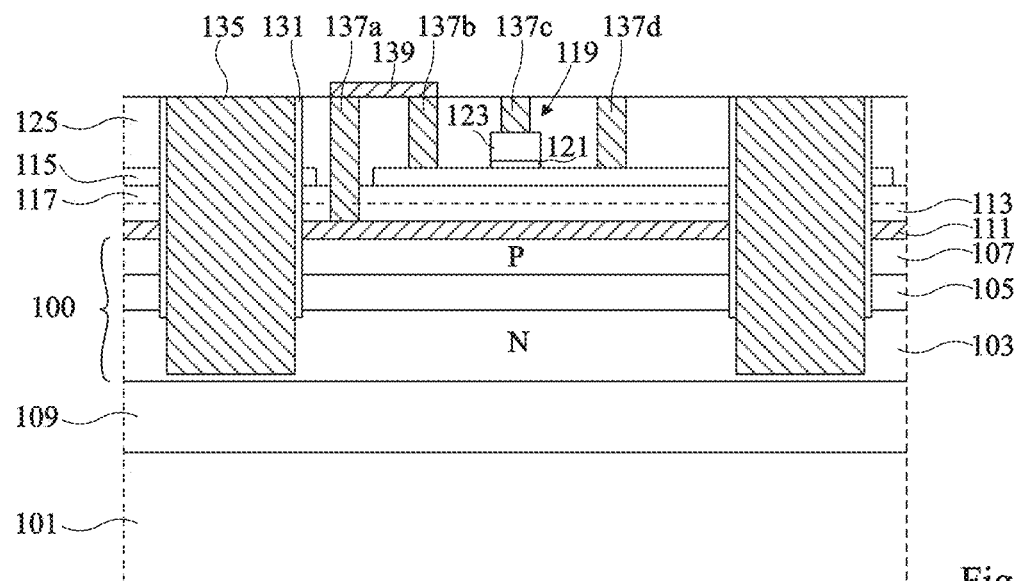
FIG. 10 illustrates a first variation of the method of FIGS. 1 to 9.

FIG. 10 is a cross-section view schematically illustrating a first alternative embodiment of the method of FIGS. 1 to 9.

The variation of FIG. 10 differs from the method of FIGS. 1 to 9 mainly in that, in this variation, the insulation pattern of the MOS transistors formed inside and on top of semiconductor layer 115 and the insulation pattern of the LEDs are self-aligned. In other words, in the variation of FIG. 10, it is not provided to delimit semiconductor walls in layer 115 prior to the forming of trenches 130, as previously described in relation with FIG. 4. Thus, in the variation of FIG. 10, during the step of local etching of semiconductor layer 115 (FIG. 4), layer 115 is only removed from the areas of subsequent forming of openings 133a

In the variation of FIG. 10, in each pixel, all the MOS transistors of the pixel formed inside and on top of semiconductor layer 115 share a same active area. The dimension of the pixels can thus be decreased. As an example, in the variation of FIG. 10, in each pixel, a single MOS transistor with a high power supply voltage, for example, a power supply voltage in the range from 3 to 15 volts, is formed inside and on top of the portion of semiconductor layer 115 of the pixel, this transistor substantially occupying the same surface as the LED of the pixel. Each pixel may further comprises transistors of lower power supply voltage, for example, with a power supply voltage in the range from 0.5 to 5 volts, formed in a second semiconductor level (not shown) above semiconductor layer 115.

Figure 11:
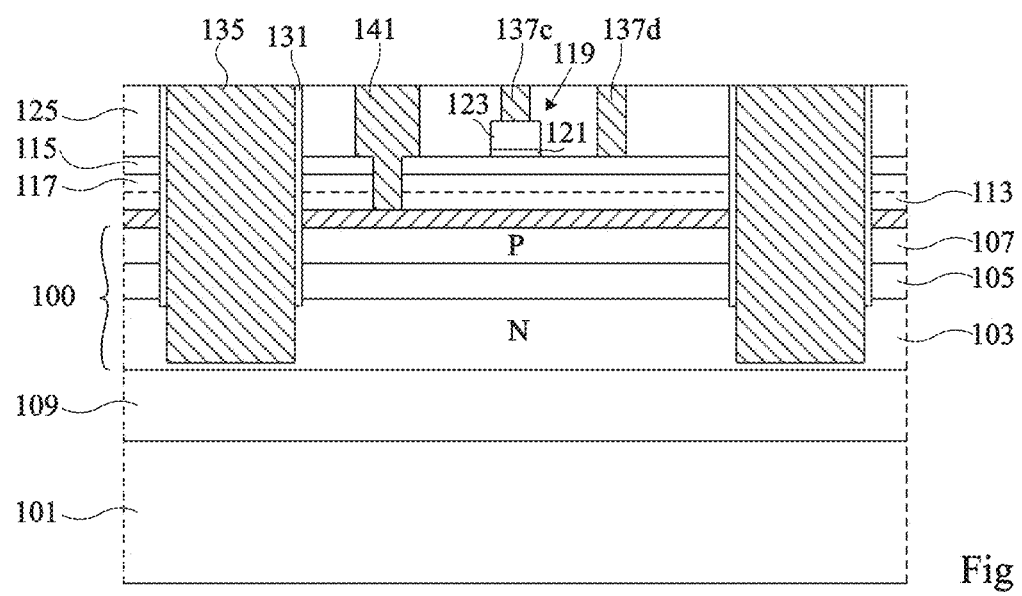
FIG. 11 illustrates a second variation of the method of FIGS. 1 to 9.

FIG. 11 is a cross-section view schematically illustrating a second alternative embodiment of the method of FIGS. 1 to 9.

The variation of FIG. 11 differs from the method of FIGS. 1 to 9 mainly in that, in this variation, in each pixel, instead of providing an anode contact metallization 137a and a source or drain contact metallization 137b connected by a conductive track 139, a single shared contact metallization 141 crossing semiconductor layer 115 and connecting the source or drain region of the MOS transistor to the anode contact conductive layer 111 of the pixel is provided.

In this variation, semiconductor layer 115 is not removed from the area where shared contact metallization 141 is formed at the step of FIG. 4.

The forming of shared contact metallization 141 for example comprises the following successive steps (not detailed in FIG. 11):

forming, from the upper surface of dielectric layer 125, a first opening vertically extending from the upper surface of semiconductor layer 115 (preferably over a previously silicided region of the upper surface of layer 115);

forming, on the lateral walls of the first opening, spacers made of a sacrificial material;

continuing the first opening in a second opening having a smaller lateral dimensions (due to the presence of the sacrificial spacers) crossing semiconductor layer 115 and vertically extending all the way to the upper surface of anode contact layer 111;

removing the sacrificial spacers;

filling the first and second openings with metal, for example, tungsten, to form metallization 141.

The metallization 141 thus formed is in contact with the upper surface of semiconductor layer 115 at the bottom of the first opening and with the upper surface of anode contact layer 111 at the bottom of the second opening.

As a variation (not shown), the opening having metallization 141 arranged therein may be formed in a single step, in which case metallization 141 is in contact with semiconductor layer 115 only by the sides of layer 115.

The variation of FIG. 11 enables to gain pixel integration density.

It should be noted that the variations of FIGS. 10 and 11 may be combined, as illustrated in FIG. 11. In this case, the step of local etching of semiconductor layer 115 of FIG. 4 may be omitted. As a variation, the shared contact metallization 141 described in relation with FIG. 11 may be provided in a device of the type shown in FIG. 9, that is, where the MOS transistor insulation pattern formed inside and on top of semiconductor layer 115 and the LED insulation pattern are not self-aligned.

FIGS. 12 to 18 are cross-section views illustrating successive steps of a third alternative embodiment of the method of FIGS. 1 to 9.

In this third variation, it is provided to integrate in the elementary cell of each pixel a capacitor connected between the gate and the source or the drain of a MOS transistor of the pixel.

The initial steps of the method are identical or similar to those described hereabove in relation with FIGS. 1 to 6, with the difference that, in the present example, after the deposition of dielectric layer 125 (FIG. 5), the latter is planarized and thinned, for example, by chem.-mech. polishing, until the access to the upper surface of the conductive gate layer 123 of the MOS transistors is freed. At the end of this step, conductive gates 123 are flush with the upper surface of dielectric layer 125.

Figure 12:
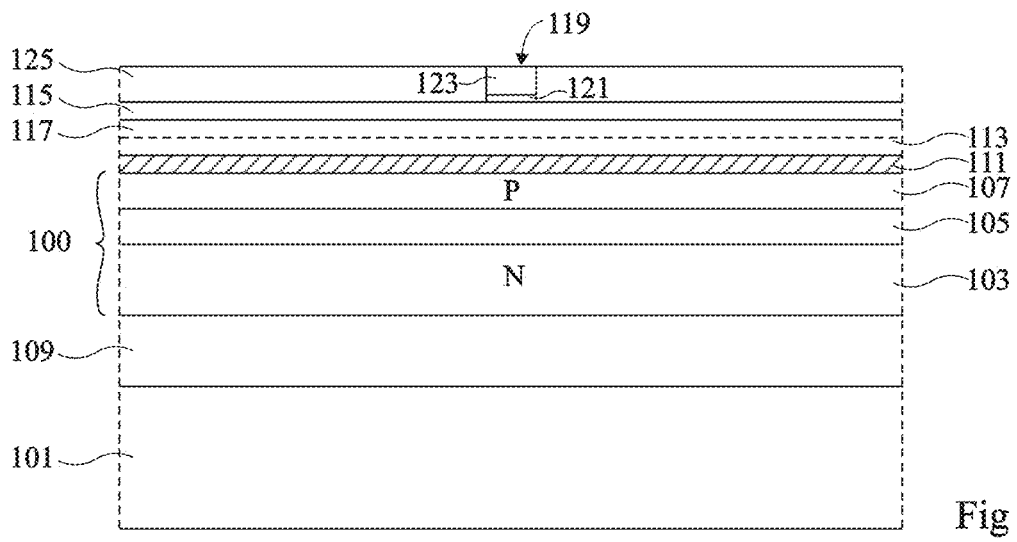
FIG. 12 illustrates a step of a third variation of the method of FIGS. 1 to 9.

FIG. 12 illustrates the structure obtained at the end of the planarization of dielectric layer 125. In the shown example, the step of local etching of semiconductor layer 115 has been omitted, and only gates 119 have been structured. In other words, at this stage, semiconductor layer 115 continuously extends over substantially the entire surface of the device. The described embodiments are however not limited to this specific case.

Figure 13:
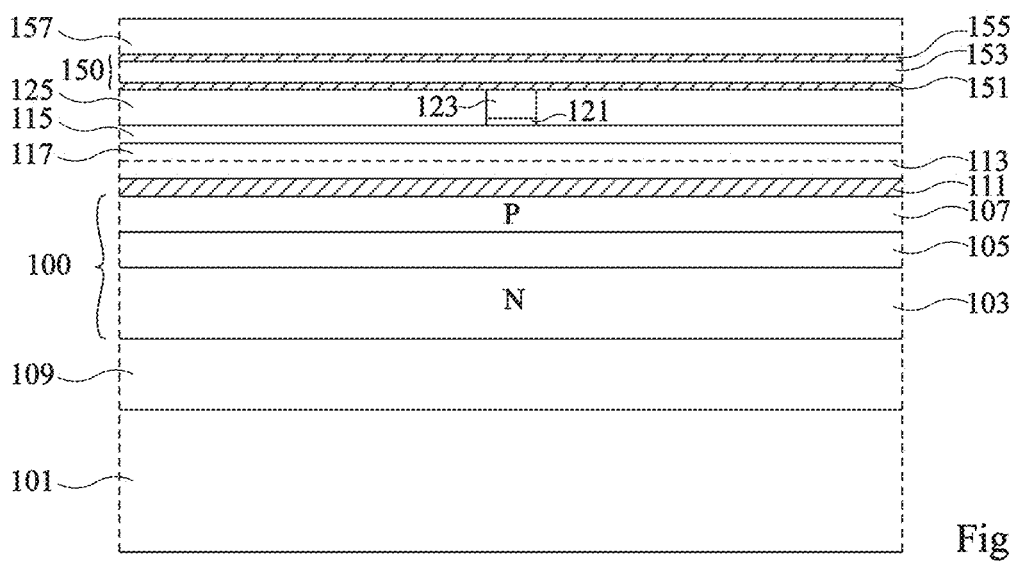
FIG. 13 illustrates another step of the third variation of the method of FIGS. 1 to 9.

FIG. 13 illustrates a step of deposition of a metal-insulator-metal (MIM) stack 150 on the upper surface of the structure of FIG. 12. Stack 150 more particularly comprises a lower metal layer 151, for example, made of titanium nitride (TiN), an intermediate insulation layer 153, for example, a hafnium layer (HfO$_2$), on top of and in contact with the upper surface of metal layer 151, and an upper metal layer 155, for example, made of tantalum oxide (Ta$_2$O$_5$), on top of and in contact with the upper surface of insulation layer 153. Lower metal layer 151 is in contact, by its lower surface, with the upper surface of the structure of FIG. 12, and particularly with the upper surface of the conductive gates 123 of the MOS transistors of the device. At this stage, each of layers 151, 153, and 155 of MIM stack 150 continuously extends across a substantially constant thickness over substantially the entire upper surface of the device.

FIG. 13 further illustrates a step of deposition of an insulating protection layer 157, for example, made of silicon oxide, on the upper surface of MIM stack 150, for example, in contact with the upper surface of metal layer 155.

Figure 14:
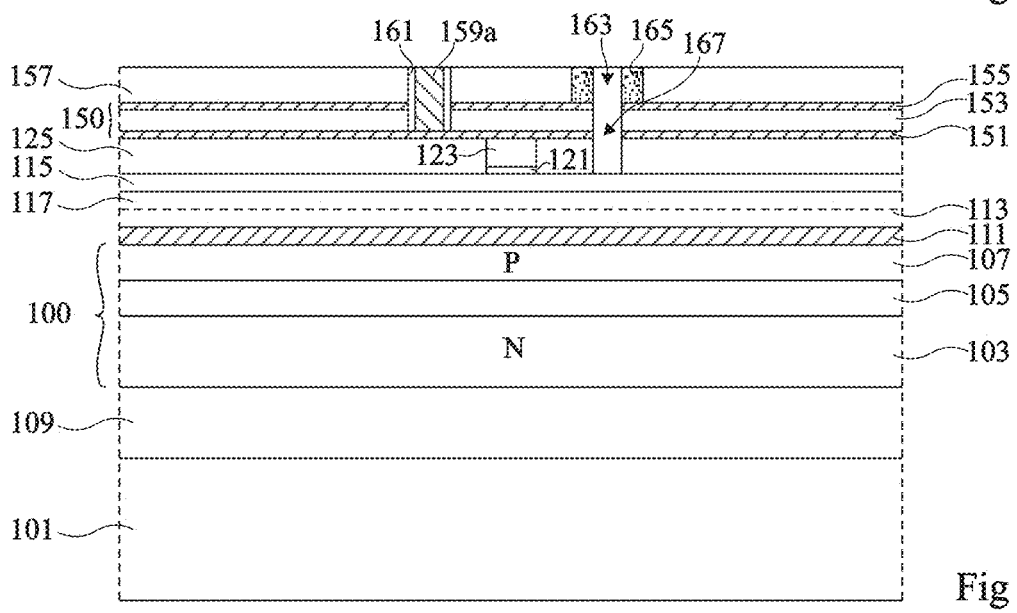
FIG. 14 illustrates another step of the third variation of the method of FIGS. 1 to 9.

FIG. 14 illustrates a step of forming, in each pixel, a first contact metallization 159*a* in contact with lower metal layer 151 of MIM stack 150 and thus with the conductive gate 123 of the pixel (via metal layer 151). Metallization 159*a* vertically extends from the upper surface of dielectric layer 157 to the upper surface of metal layer 151, and is laterally insulated from the upper metal layer 155 of MIM stack 150 by an insulation layer 161.

The forming of metallization 159*a* for example comprises the following successive steps (not detailed in the drawing):

forming an opening vertically extending from the upper surface of dielectric layer 157 to the upper surface of metal layer 151, through layers 157, 155, and 153;

depositing an insulation layer 161, for example, made of silicon oxide, coating the lateral walls and the bottom of the opening, and then removing insulation layer 161 from the bottom of the opening, for example, by vertical anisotropic etching, to only keep layer 161 on the lateral walls of the opening; and filling the opening with metal, for example, tungsten, to form metallization 159*a*.

It should be noted that metallization 159*a* is not necessarily vertically in line with the conductive gate 123 of a MOS transistor of the pixel, but may be offset with respect to the gate, as shown in FIG. 14. As a variation, metallization 159*a* may be located vertically in line with gate 123.

FIG. 14 further illustrates steps for the forming of a contact metallization 159*b* (FIG. 15) shared between the upper metal layer 155 of MIM stack 150 and a source or drain region of the MOS transistor of the pixel.

FIG. 14 more particularly illustrates the following successive steps (not detailed in the drawing):

forming a first opening 163 vertically extending from the upper surface of dielectric layer 157 to the upper surface of metal layer 155;

forming spacers 165 made of a sacrificial material on the lateral walls of opening 163; and continuing opening 163 by a second opening 167 having a small lateral dimension (due to the presence of spacers 165) crossing layers 155, 153, 151, and 125 and emerging on the upper surface of semiconductor layer 115, at the level of a source or drain contact region of the transistor (preferably previously silicided to ease the control of the etching and favor the electric drain or source contact).

Figure 15:
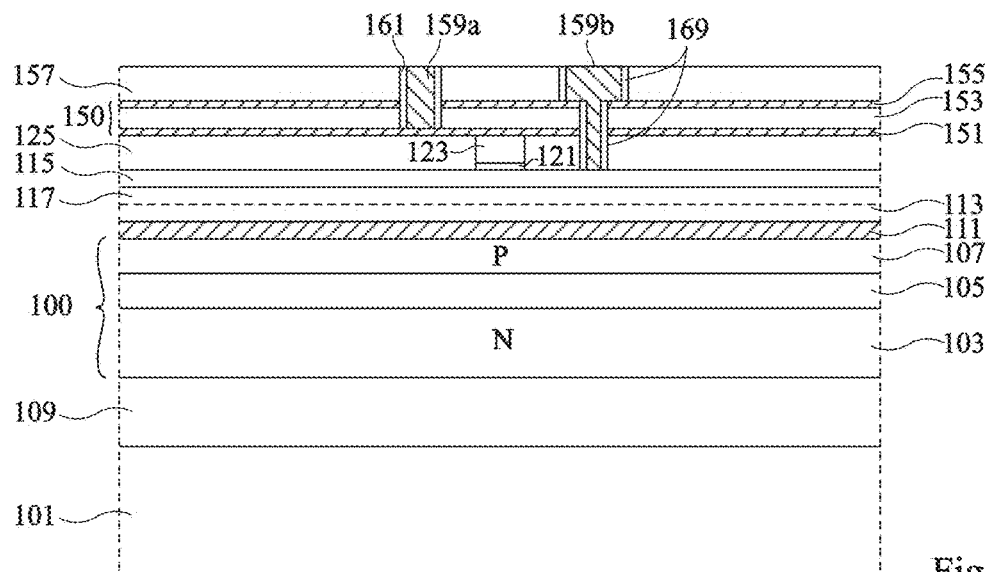
FIG. 15 illustrates another step of the third variation of the method of FIGS. 1 to 9.

FIG. 15 illustrates the forming of the actual contact metallization 159*b*, comprising the following successive steps (not detailed in the drawing):

removing sacrificial spacers 165;

depositing an insulation layer 169, for example, made of silicon oxide, having a thickness smaller than that of sacrificial spacers 165, on the lateral walls and on the bottom of openings 163 and 167;

removing insulation layer 169 from the bottom of openings 163 and 167, for example, by vertical anisotropic etching, to only keep layer 169 on the lateral walls of openings 163 and 167; and filling openings 163 and 167 with metal, for example, tungsten, to form metallization 159*b*.

Metallization 159b is thus in contact with the upper metal layer of MIM stack 150, at the bottom of opening 163, and with semiconductor layer 115, at the bottom of opening 165, and is insulated from lower conductive layer 151 of MIM stack 150 by lateral insulation layer 169.

Figure 16:
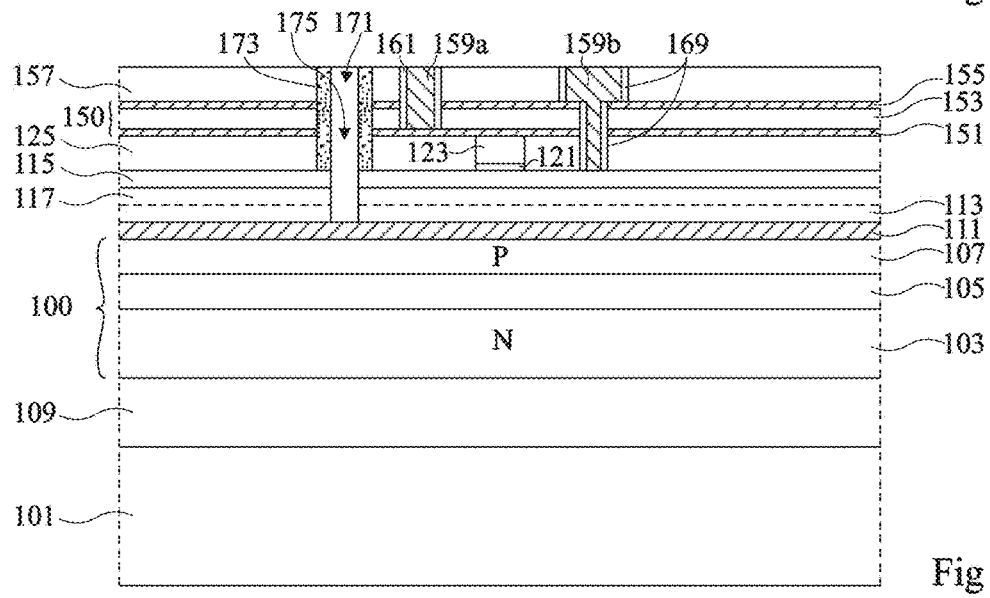
FIG. 16 illustrates another step of the third variation of the method of FIGS. 1 to 9.

FIG. 16 illustrates steps for the forming of a contact metallization 159c (FIG. 17) shared between semiconductor layer 115, at the level of a drain or source region of the MOS transistor of the pixel, and the anode contact layer 111 of the pixel.

FIG. 16 more particularly illustrates the following successive steps (not detailed in the drawing):
- forming a first opening 171 vertically extending from the upper surface of dielectric layer 157 to the upper surface of semiconductor layer 115, at the level of a drain or source contact region of the transistor (preferably previously silicided);
- forming spacers 173 made of a sacrificial material on the lateral walls of opening 171; and
- continuing opening 171 by a second opening 175 having a small lateral dimension (due to the presence of spacers 173) crossing layers 115, 117, and 113 and emerging onto the upper surface of the anode contact metal layer 111 of the pixel.

Figure 17:
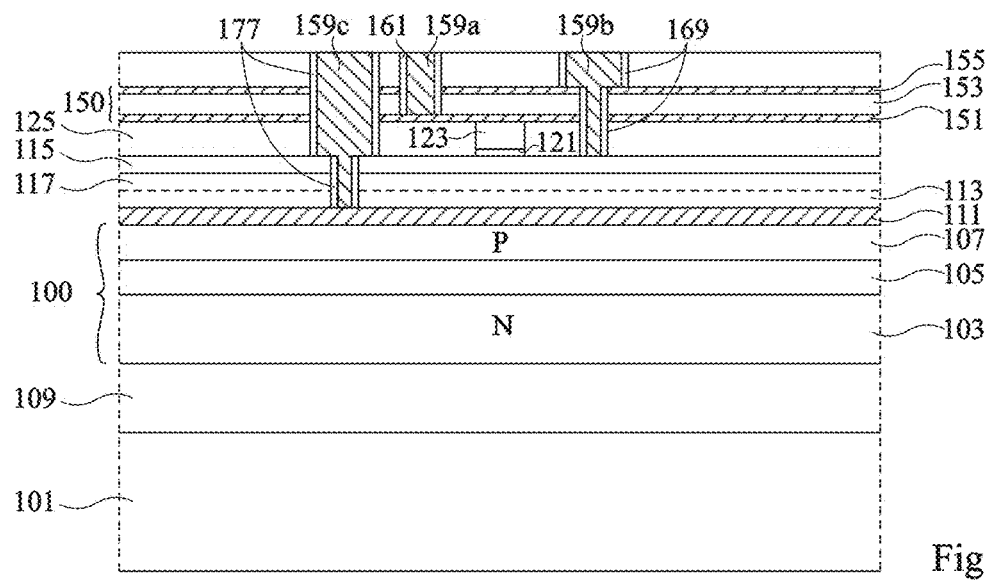
FIG. 17 illustrates another step of the third variation of the method of FIGS. 1 to 9.

FIG. 17 illustrates the forming of the actual contact metallization 159c, comprising the following successive steps (not detailed in the drawing):
- removing sacrificial spacers 173;
- depositing an insulation layer 177, for example, made of silicon oxide, having a thickness smaller than that of sacrificial spacers 173, on the lateral walls and on the bottom of openings 171 and 175;
- removing insulation layer 177 from the bottom of openings 171 and 175, for example, by vertical anisotropic etching, to only keep layer 177 on the lateral walls of openings 171 and 175; and
- filling openings 171 and 175 with metal, for example, tungsten, to form metallization 159c.

Metallization 159c is thus in contact with semiconductor layer 115 at the bottom of opening 171 and with anode contact metal layer 111 at the bottom of opening 175, and is insulated from the metal layers 151 and 155 of MIM stack 150 by lateral insulation layer 177.

Figure 18:
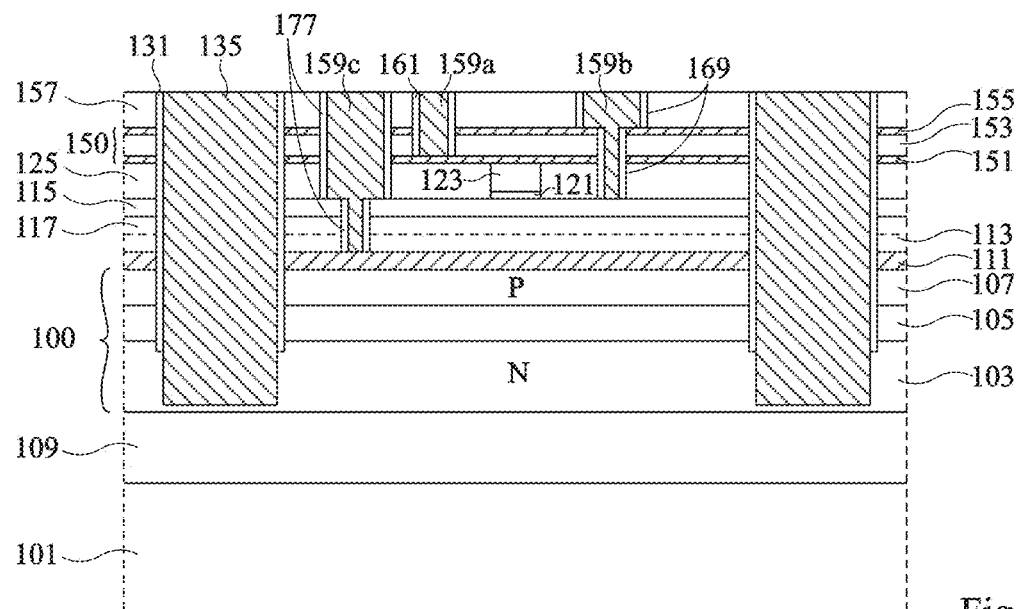
FIG. 18 illustrates another step of the third variation of the method of FIGS. 1 to 9.

FIG. 18 illustrates the forming of a cathode contact metallization 135 common to all the sensor pixels, arranged in trenches extending vertically from the upper surface of dielectric layer 157 to an intermediate level in semiconductor layer 103, and laterally insulated from layers 151, 155, 115, 111, 107, and 105 by a lateral insulation layer 131. Cathode contact metallization 135 may be formed by a method similar to what has been previously described, with the difference that, in this variation, the pixel delimitation trenches also cross MIM stack 150.

An advantage of the method of FIGS. 12 to 18 is that it enables to form, in each pixel, a capacitor having a lower electrode 151 connected to the conductive gate 123 of a MOS transistor of the pixel, and an upper electrode 155 connected to a source or drain region of this same transistor.

According to the desired electric diagram of the elementary pixel control cell, this method may be adapted to form a plurality of different capacitors per pixel in MIM stack 150.

Further, although an advantageous embodiment where contact metallizations 159b and 159c are shared has been described hereabove, the described embodiments are not limited to this specific case. As a variation, one or each of the two metallizations 159b and 159c may be replaced with two different metallizations coupled by a conductive track arranged on the upper surface of dielectric layer 157.

Further, the alternative embodiment of FIGS. 12 to 18 is not limited to the example illustrated in the drawings where the pattern of insulation of the MOS transistors formed inside and on top of semiconductor layer 115 and the LED insulation pattern are self-aligned.

Figure 19:
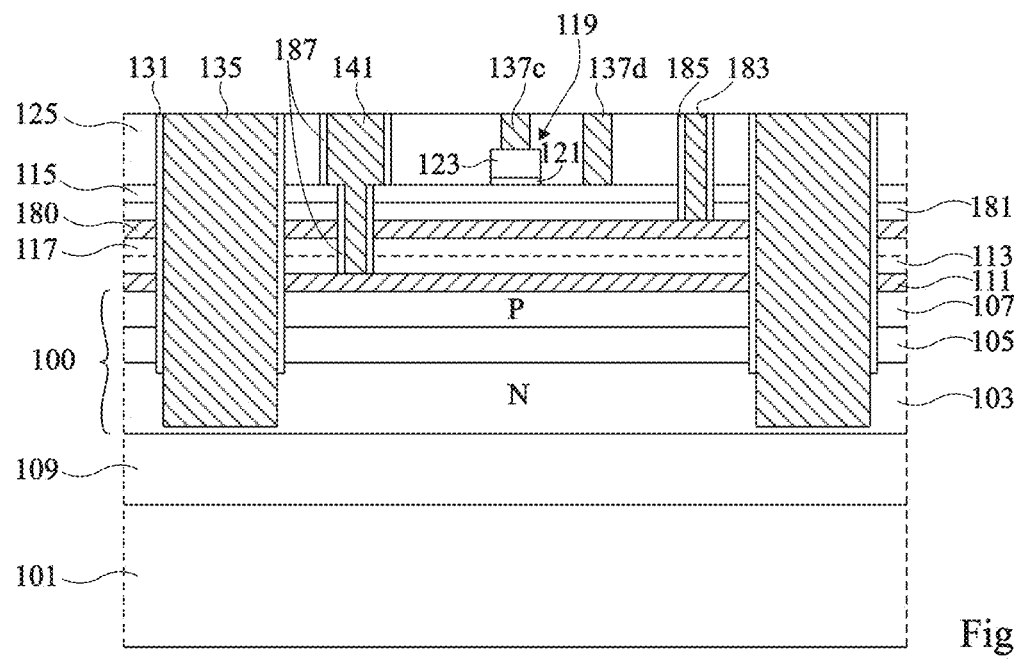
FIG. 19 illustrates a fourth variation of the method of FIGS. 1 to 9.

FIG. 19 is a cross-section view schematically illustrating a fourth alternative embodiment of the method of FIGS. 1 to 9.

The variation of FIG. 19 differs from what has been previously described mainly in that the device further comprises, in each pixel, between anode contact semiconductor conductive layer 111 and semiconductor layer 115, a ground plane 180 formed by a layer of a conductive or semiconductor material, for example, a doped polysilicon layer. In operation, ground plane 180 is maintained at a reference potential of the device, for example, the ground, and enables to decouple the LED from the elementary pixel control cell, and particularly to avoid for the relatively high voltage levels applied to the anode contact level of the LED to induce a modification of the behavior of the transistor(s) of the elementary pixel control cell.

In the shown example, ground plane 180 is arranged between dielectric layer 117 and semiconductor layer 115, an additional dielectric layer 181, for example, made of silicon oxide, forming an interface between ground plane 180 and semiconductor layer 115.

As an example, ground plane 180 may be placed on the upper surface of insulation layer 113 at the same time as semiconductor layer 115, at the step of FIG. 3. As a variation, ground plane 180 may be deposited on the upper surface of insulation layer 113 before the transfer of semiconductor layer 115.

The rest of the method is for example identical or similar to what has been previously described, with the difference that:
- the metallization for contacting anode contact layer 111 of the LED crosses ground plane 180 and should thus be insulated from ground plane 180; and
- each pixel comprises an additional contact metallization 183 for the biasing of ground plane 180.

In the shown example, the additional contact metallization 183 crosses semiconductor layer 115 and is insulated therefrom by a lateral insulation layer 185, for example, made of silicon oxide.

Further, in this example, contact metallization 141 is a metallization shared with semiconductor layer 115, similar to what has been described in the example of FIG. 11. However, in the variation of FIG. 19, metallization 141 crosses ground plane 180 and is insulated therefrom by a lateral insulation layer 187, for example, made of silicon oxide.

The variation of FIG. 19 may of course be combined with all the previously-described variations.

Various embodiments and variations have been described. It will be understood by those skilled in the art that certain features of these various embodiments and variations may be combined, and other variations will occur to those skilled in the art. In particular, the described embodiments are not limited to the above-described examples of materials, nor are they to the examples of dimensions mentioned hereabove.

Further, the conductivity types of semiconductor layers 103 and 107 of LED stack 100 may be inverted.

Further, although only embodiments of display devices based on LEDs have been described, the described embodiments may be adapted to the manufacturing of a sensor comprising a plurality of photodiodes, for example, made of gallium nitride, individually addressable to acquire an image.

More generally, the described embodiments may be adapted to the manufacturing of any display device or photosensitive sensor based on semiconductor diodes, including made up of semiconductor materials other than gallium nitride, for example, diodes made up of other III-V semiconductor materials or diodes made up of silicon.

What is claimed is:

1. A method of manufacturing an optoelectronic device, comprising the steps of:
    a) providing, on top of a substrate, an active diode stack comprising a first doped semiconductor layer of a first conductivity type and a second doped semiconductor layer of the second conductivity type, coating the upper surface of the first layer; and
    b) arranging a third semiconductor layer on the upper surface of the active stack, the third semiconductor layer being a single-crystal silicon layer;
    wherein, after step b) each of the first doped semiconductor layer, the second doped semiconductor layer and the third semiconductor layer extends continuously and has a substantially uniform thickness over the entire surface of the substrate, the method further comprising the steps of:
    c) after step b), forming at least one MOS transistor inside and on top of the third semiconductor layer, the forming comprising a step of implantation of source and drain regions of the transistor inside the third semiconductor layer; and
    d) after step b), before or after step c), forming trenches vertically extending through a plane corresponding to the third layer or directly through the third layer and emerging into the first layer or onto the upper surface of the first layer and delimiting a plurality of pixels, each comprising a diode and an elementary diode control cell.

2. The method of claim 1, further comprising a step of filling the trenches with metal to form a metallization of contact with the first semiconductor layer, common to all the pixels of the device.

3. The method of claim 2, wherein, before the filling of the trenches with metal, an insulation layer is deposited on the lateral walls of the trenches.

4. The method of claim 1, wherein, after step b) and before step d), the third semiconductor layer is removed from the trench-forming areas.

5. The method of claim 1, wherein the third semiconductor layer is not removed from the trench-forming areas before step d).

6. The method of claim 1, further comprising, after step b), a step of forming, in each pixel, a metallization of contact with the second semiconductor layer, and a metallization of contact with the third semiconductor layer.

7. The method of claim 6, wherein the metallization of contact with the second semiconductor layer and the metallization of contact with the third semiconductor layer are distinct metallizations, connected to each other by a conductive track in contact with the upper surfaces of said metallizations.

8. The method of claim 6, wherein the metallization of contact with the second semiconductor layer and the metallization of contact with the third conductive layer are confounded and are arranged in a same opening crossing the third semiconductor layer.

9. The method of claim 1, further comprising, after step c), a step of depositing a metal-insulator-metal stack, a lower metal layer of the metal-insulator-metal stack being in contact with a conductive gate of said at least one MOS transistor.

10. The method of claim 9, further comprising a step of forming, in each pixel, a metallization in contact both with an upper metal layer of the metal-insulator-metal stack and with the third semiconductor layer.

11. The method of claim 1, further comprising, before step c), the forming of a conductive or semiconductor ground plane between the second semiconductor layer and the third semiconductor layer, the ground plane being insulated from the second and third semiconductor layers.

12. The method of claim 11, comprising a step of forming, in each pixel, a metallization of contact with the ground plane, said metallization being arranged in an opening crossing the third semiconductor layer.

13. The method of claim 1, wherein the diodes are light-emitting diodes.

14. The method of claim 1, wherein the first and second semiconductor layers are layers made up of III-V semiconductor materials, and the third semiconductor layer is made of silicon.

15. The method of claim 1, wherein, at step c), the MOS transistor forming temperature does not exceed 500° C.

* * * * *